(12) United States Patent
Su et al.

(10) Patent No.: US 9,543,161 B1
(45) Date of Patent: Jan. 10, 2017

(54) METHOD OF PLANARIZATING FILM

(71) Applicant: Taiwan Semiconductor Manufacturing Co., Ltd., Hsin-Chu (TW)

(72) Inventors: Ying-Hao Su, Hsinchu (TW); Yu-Lun Liu, Changhua County (TW); Chi-Kang Chang, New Taipei (TW); Shih-Chi Fu, Hsinchu (TW); Kuei-Shun Chen, Hsinchu (TW); Chloe Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/040,065

(22) Filed: Feb. 10, 2016

(51) Int. Cl.
*H01L 21/3105* (2006.01)
*H01L 21/027* (2006.01)

(52) U.S. Cl.
CPC ..... *H01L 21/31055* (2013.01); *H01L 21/0274* (2013.01)

(58) Field of Classification Search
CPC ............. H01L 21/0274; H01L 21/31055
See application file for complete search history.

(56) References Cited

U.S. PATENT DOCUMENTS

| 7,667,271 | B2 | 2/2010 | Yu et al. |
|---|---|---|---|
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 2014/0001574 | A1 | 1/2014 | Chen et al. |
| 2014/0110755 | A1 | 4/2014 | Colinge |
| 2014/0151812 | A1 | 6/2014 | Liaw |
| 2015/0311182 | A1* | 10/2015 | Lee ............ H01L 23/3737 257/734 |

\* cited by examiner

*Primary Examiner* — Daniel Shook
(74) *Attorney, Agent, or Firm* — Haynes and Boone, LLP

(57) ABSTRACT

A method of fabricating a semiconductor device is disclosed. The method includes forming a flowable-material (FM) layer over a substrate. The substrate has a first region and a second region. A top surface of the FM layer in the first region is higher than a top surface of the FM layer in the second region. The method also includes forming a plurality of trenches in the FM layer in the first region and performing annealing process to reflow the FM layer, wherein the plurality of trenches are filled with the FM layer.

20 Claims, 6 Drawing Sheets

METHOD OF PLANARIZATING FILM

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in planarizing a film layer are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
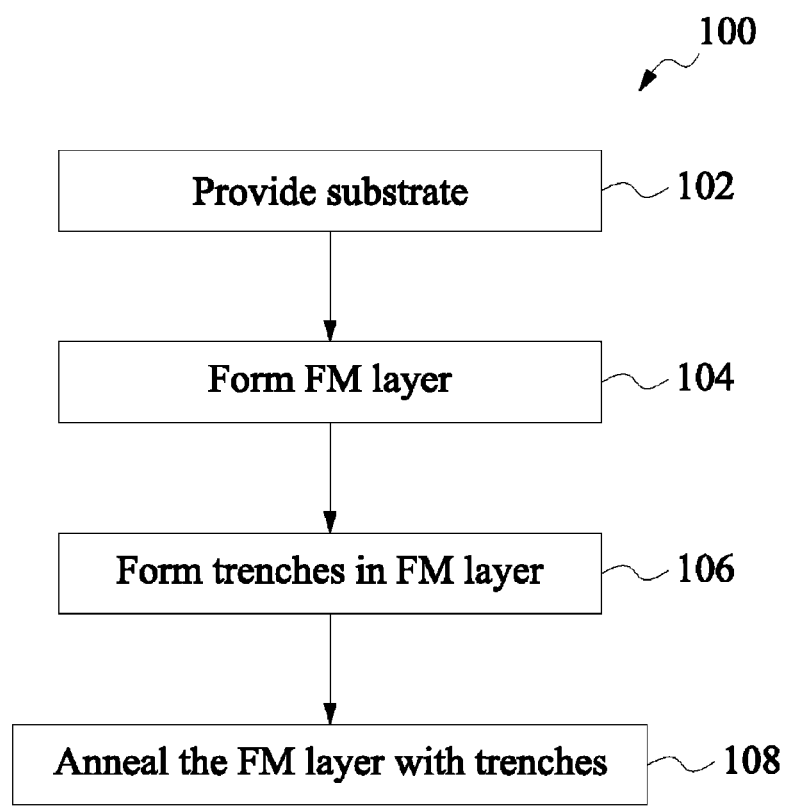
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3, 4A, 4B, 5A, 5B, 5C, 5D, 6A and 6B.

Figure 2:
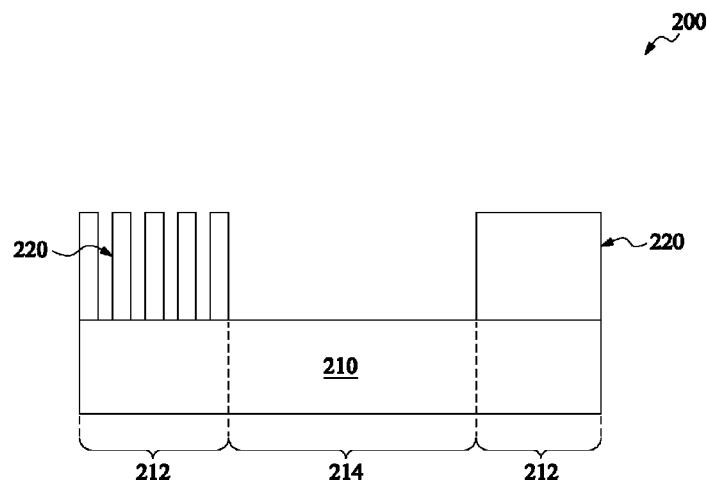
FIGS. 2, 3, 4A, 4B, 5A, 5B, 5C, 5D, 6A and 6B are cross-sectional views of an example semiconductor device in accordance with some embodiments.

Referring to FIGS. 1 and 2, the method 100 begins at step 102 by providing a substrate 210 having a plurality of features 220 protruding from the substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation regions. The isolation regions separate various device regions in the substrate 210. The isolation regions include different structures formed by using different processing technologies. For example, the isolation region may include shallow trench isolation (STI) regions. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include a plurality of inter-level dielectric (ILD) layers such as silicon oxide, silicon nitride, silicon oxynitride, a low-k dielectric, silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The features 220 may include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials and/or a combination thereof.

The features 220 may also include source/drain (S/D) features, which include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 220 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The features 220 may also include conductive features integrated with the ILD layer in the substrate 210 to form an interconnect structure configured to couple the various p-type and n-type doped regions and the other functional features (such as gate electrodes), resulting a functional integrated circuit. In one example, the features 220 may include a portion of the interconnect structure and the interconnect structure includes a multi-layer interconnect (MLI) structure and an ILD layer over the substrate 210 integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In the present embodiment, the substrate 210 has a first region 212 and a second region 214. A first area ratio $A_1$ of a total area of the feature 220 to a total area of the substrate 210 in the first region 212 is substantial different than a second area ratio $A_2$ of a total area of the feature 220 to a total area of the substrate 210 in the second region 214. In the present embodiment, the first area ratio $A_1$ is higher than the second area ratio $A_2$. The first area ratio $A_1$ may vary from one first region 212 to another first region 212 and the second area ratio $A_2$ may vary from one second region 212 to another second region 212. In an embodiment, the first area ratio $A_1$ is more than 30% greater than second area ratio $A_2$. In an example, the first area ratio $A_1$ in one first region 212 is about 40% and in another first region 212 is about 100% while the second area ratio $A_2$ is zero (or no feature 220 is formed in the second region 214).

Figure 3:
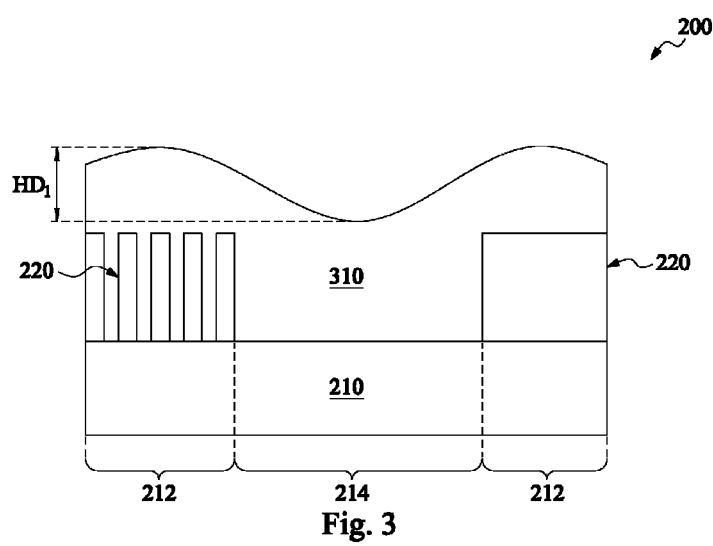

Referring to FIGS. 1 and 3, method 100 proceeds to step 104 by forming a flowable-material (FM) layer 310 over the substrate 210, including over the features 220. In the FM layer 310 include a material which fills in spaces between each of features 220 with a flowing nature. The FM layer 310 may include photoresist, polyimide, spin-on-glass (SOG), spin-on-polymer (SOP), combinations thereof, and/or other suitable materials. In some embodiment, the FM layer 310 is different from the plurality of feature 220 and the substrate 210 to achieve etching selectivity in subsequent etches. In an embodiment, the FM layer 310 includes photoresist layer. The FM layer 310 may be formed by spin-on coating, CVD, and/or other suitable techniques. Usually the formation process of the FM layer 310 is a simple low cost deposition process (such as spin-on coating) that is often used during device fabrication.

Typically, topography of the FM layer 310 after deposition is influenced (or impacted) by the topography of the underlying material layer(s). In the present embodiment, due to difference between the first area ratio $A_1$ and the second area ratio $A_2$, it is common that the FM layer 310 has a non-flat topography (or rugged topography) after it is formed over the features 220 on the substrate 210, such that a top surface of the FM layer 310 in the first region 212 is higher than it is in the second region 214. This is sometimes referred to as coating-loading-effect. A first height difference $HD_1$ is defined as a height difference between the highest point of the surface of the FM layer 310 in the first region 212 and the lowest point of the FM layer 310 in the second region 214. This rugged topography of the FM layer 310 may result in adverse effects in subsequent processes such as poor depth-of-field in lithography processes, forming stringers in etching processes, poor step-coverage in deposition processes, and all of these adverse effects eventually may reduce the yield of the device 200. The present disclosure provides a method to reduce the $HD_1$ and improve the degree of planarization of the FM layer 310.

Figure 4A:
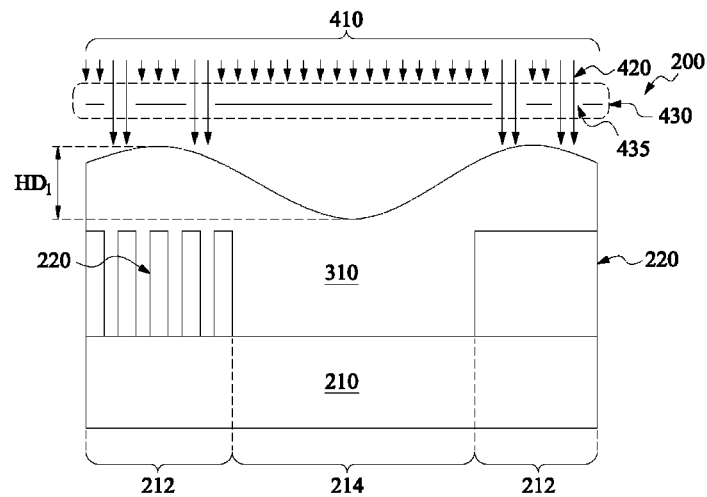
Figure 4B:
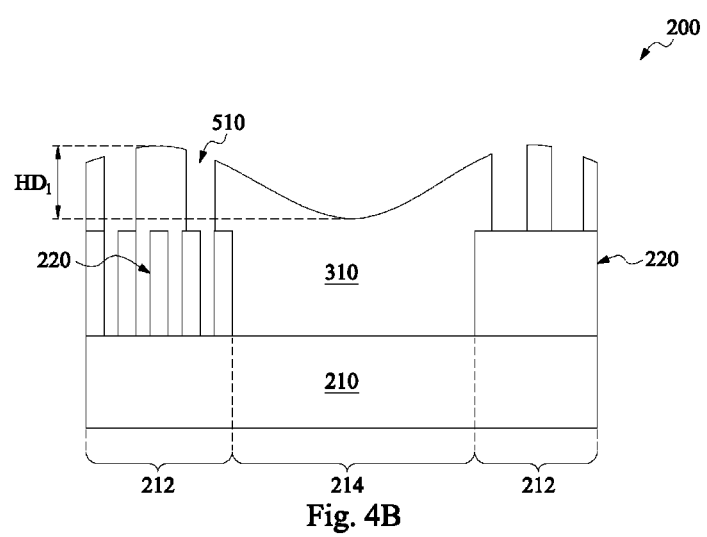

Referring to FIGS. 1, 4A and 4B method 100 proceeds to step 106 by forming a plurality of trenches 510 in the FM layer 310. In the present embodiment, the FM layer 310 is a photoresist layer and it is exposed to a radiation beam 420 from a light source 410 through a photomask (mask or reticle) 430, as shown in FIG. 4A. The light source 410 may be a variety of sources, including a deep ultra-violet (DUV) source. In one example, the light source 410 may be an extreme ultraviolet (EUV) light source. In some examples, other light sources 410 such as electron beam (e-beam) writing. Alternatively, the exposure process may utilize other radiation beams, such as ion beam, x-ray, and other proper exposure energy. Additionally, a pre-bake of the photoresist layer 310 may be performed prior to the exposure process in order to cure and dry the photoresist layer 410.

The photomask 430 has a plurality of openings 435. According to respective first area ratio $A_1$ and the second area ratio $A_2$, the photomask 430 is designed such that a width of the opening 435 may vary from one opening 435 to another opening 435 and vary from one region to another region. Also, a total number of the openings 435 may vary from one region to another region. In other words, the total number of the openings 435 may be different from one region to another region.

In the present embodiment, the photomask 430 has a plurality of openings 435 in the first region 212 while having no openings in the second region 214. During exposure, the light beams 420 reach the FM layer 310 through the openings 435 and it changes solubility of the exposed photoresist layer 310 such as increasing solubility when photoresist layer 310 is a positive tone photoresist. Additionally, the photoresist layer 310 may be subjected to a post-exposure bake (PEB). Subsequently, a developing solution may be utilized to remove exposed portions of the photoresist layer 310 to form the plurality of trenches 510. As a result, the plurality of trenches 510 may be formed with various widths and various total numbers from one first region 212 to another first region 212. Portions of the feature 220 may be exposed within the respective trenches 510.

Figure 5A:
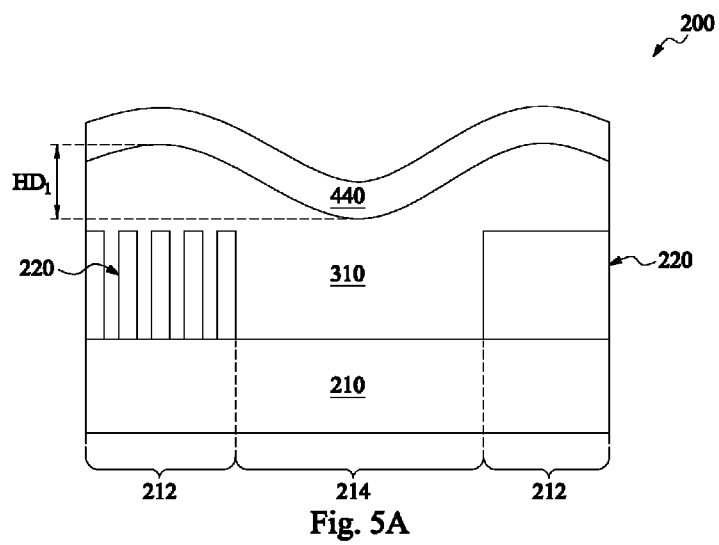
Figure 5B:
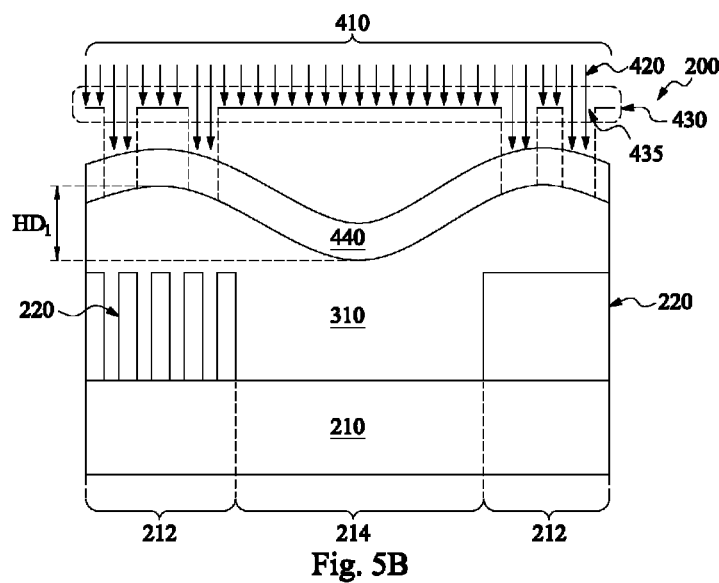
Figure 5C:
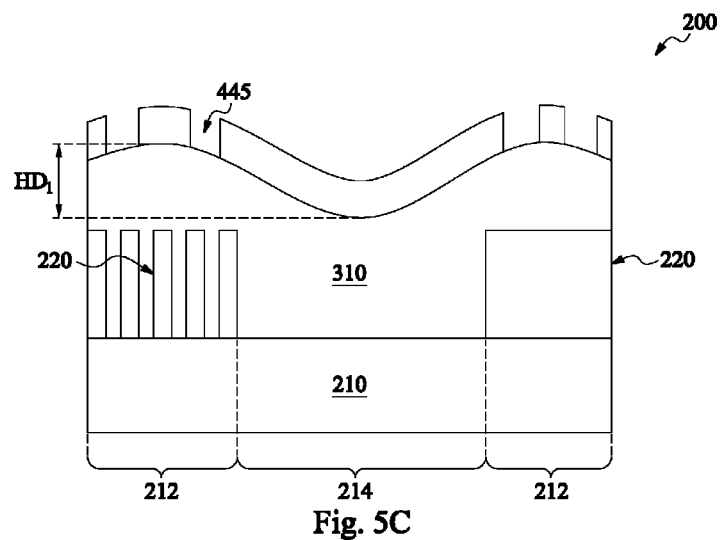
Figure 5D:
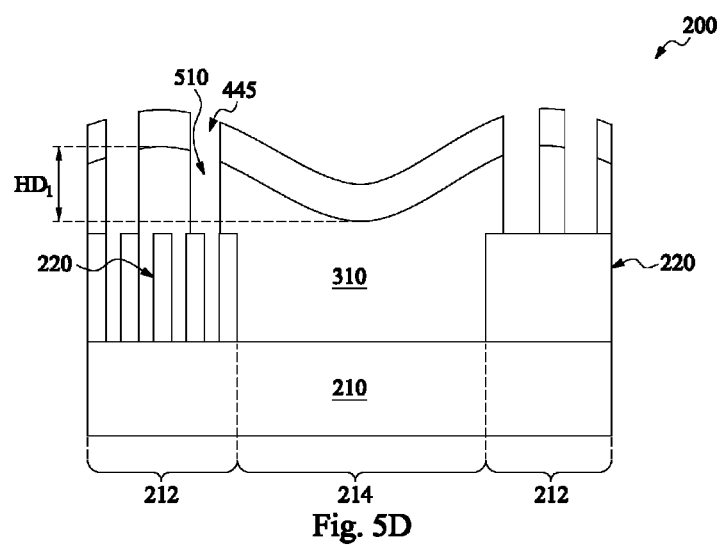

As shown in FIGS. 5A, 5B, 5C and 5D, for circumstances where the FM layer 310 is not a photoresist layer, a photoresist layer 440 is formed over the FM layer 310 by spin-on coating, as shown in FIG. 5A. The photoresist layer 440 is then exposed to the radiation beam 420 from the light source 410 through the photomask (mask or reticle) 430, which has the plurality of openings 435, as shown in FIG. 5B. The photoresist layer 440 is developed by a developing solution to remove exposed portions of the photoresist layer 440 to form photoresist openings 445, as shown in FIG. 5C. The FM layer 310 is then etched through the photoresist openings 445 to form the trenches 510, as shown in FIG. 5D. As has been mentioned previously, the etch process is chosen to selectively etch the FM layer 310 without etching the exposed features 220 and the substrate 210. As a result, portions of the feature 220 may be exposed within the respective trenches 510. The etch process may include a selective wet etch, a selective dry etch, and/or a combination thereof. As an example, a selective wet etching solution may include $HNO_3$, $NH_4OH$, KOH, HF, HCl, NaOH, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. After forming the trenches 5100, the photoresist layer 440 is removed by wet stripping and/or plasma ashing.

Figure 6A:
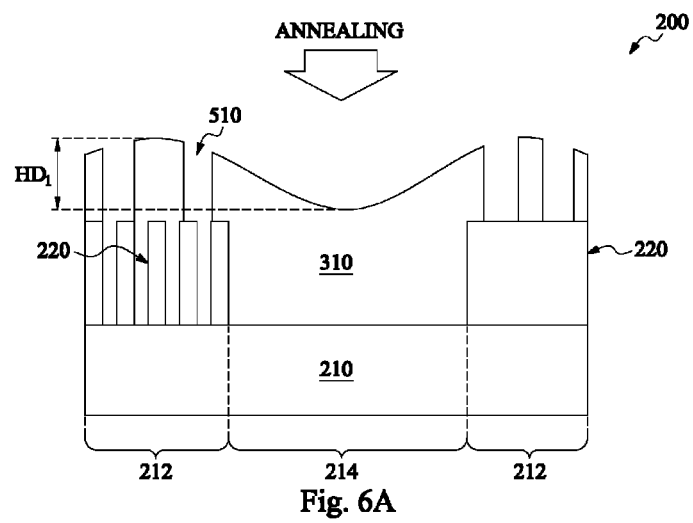
Figure 6B:
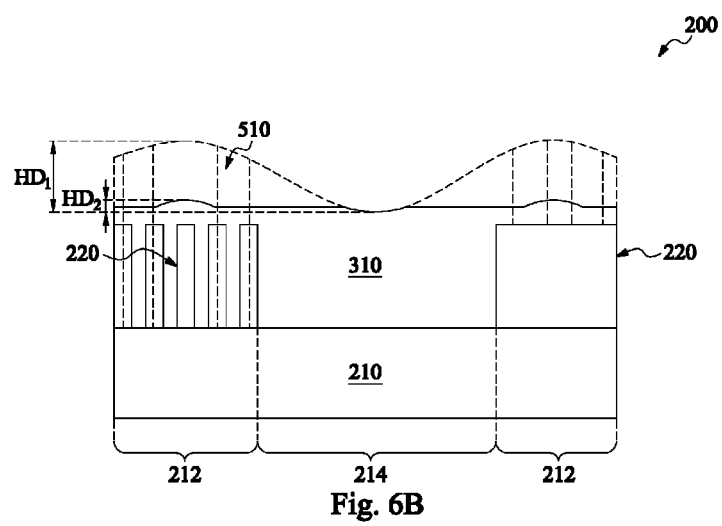

Referring to FIGS. 1, 6A and 6B, method 100 proceeds to step 108 by annealing process to reflow the remaining FM layer 310 (having the trenches 510 in the first region 212). During the annealing process, the remaining FM layer 310 reflows such that the remaining FM layer 310 near the respective trench 510 fills in the trench 510 and results in decreasing thickness of the remaining FM layer 310 in the first region 212. Thus, after reflowing, the remaining FM layer 310 has a more planarized topography such that a second height difference $HD_2$ is much smaller than the $HD_1$, here $HD_2$ is defined as a height difference between the highest point in the first region 212 and the lowest point in the second region 214 after the remaining FM layer 310 reflowing. In an embodiment, the second height difference $HD_2$ is about 10%-60% of the first height difference $HD_1$. As has been mentioned above, by choosing width and number of the opening 435 of the photomask 430, the $HD_2$ can be reduced and a planarization of the remaining FG layer 310 is achieved.

The annealing process may include a rapid thermal anneal (RTA), a laser anneal, a furnace anneal, and/or a flash lamp anneal. The annealing process may be conducted in an oxidizing ambient, a combination of steam ambient and oxygen ambient or under an inert gas atmosphere. As an example, the annealing process is performed to the photoresist layer 310, with a temperature range from about 250° C. to about 400° C., by an oven a vacuum environment.

Additional steps can be provided before, during, and after the method 100, and some of the steps described can be replaced or eliminated for other embodiments of the method.

Based on the above, the present disclosure offers methods for reducing coating-loading-effect. The method employs forming a plurality trenches in a FM layer and reflowing the FM layer to filling the plurality of trenches to increase degree of planarization of the FM layer. The method also employs modulating widths of each of trenches and total local number of trenches to achieve desired planarization of the FM layer. The method demonstrates a feasible, flexible and low cost planarization method for the FM layer.

The present disclosure provides many different embodiments of fabricating a semiconductor device that provide one or more improvements over existing approaches. In one embodiment, a method for fabricating a semiconductor device includes forming a flowable-material (FM) layer over a substrate. The substrate has a first region and a second region. A top surface of the FM layer in the first region is higher than a top surface of the FM layer in the second region. The method also includes forming a plurality of trenches in the FM layer in the first region and performing annealing process to reflow the FM layer, wherein the plurality of trenches are filled with the FM layer.

In another embodiment, a method includes providing a substrate having a plurality of features protruding from the substrate and forming a photoresist layer over a substrate, including over the plurality of features. A top surface of the photoresist layer in a first region of the substrate is higher than a top surface of the photoresist layer in a second region of the substrate. The method also includes forming a plurality of trenches in the photoresist layer in the first region and re-flowing the photoresist layer to fill in the plurality of trenches.

In yet another embodiment, a method includes forming a flowable-material (FM) layer over a first region of the substrate and a second region of the substrate. A top surface of the FM layer in the first region is higher than a top surface of the FM layer in the second region. The method also includes forming a patterned photoresist layer over the FM layer, forming a plurality of trenches in the FM layer in the first region through the patterned photoresist layer and performing annealing process to reflow the FM layer into the plurality of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a flowable-material (FM) layer over a substrate, the substrate having a first region and a second region, wherein a top surface of the FM layer in the first region is higher than a top surface of the FM layer in the second region;
forming a plurality of trenches in the FM layer in the first region; and
performing annealing process to reflow the FM layer, wherein the plurality of trenches are filled with the FM layer.
2. The method of claim 1, wherein the FM layer includes photoresist layer.
3. The method of claim 2, wherein forming the plurality of trenches in the FM layer in the first region includes performing a lithography radiation exposing process through a photomask, wherein the photomask has a plurality of openings the first region.

4. The method of claim 3, wherein a width of each of the plurality of openings varies from one opening to another opening.

5. The method of claim 3, wherein the plurality of openings each have the same width.

6. The method of claim 1, wherein forming the plurality of trenches in the FM layer in the first region includes:
forming a patterned photoresist layer over the FM layer; and
etching the FM layer through the patterned photoresist layer.

7. The method of claim 1, further comprising forming a plurality of features over the substrate in the first region, and
wherein forming the FM layer over the substrate includes forming the FM layer over the plurality of features.

8. A method comprising:
providing a substrate having a plurality of features protruding from the substrate;
forming a photoresist layer over a substrate, including over the plurality of features, wherein a top surface of the photoresist layer in a first region of the substrate is higher than a top surface of the photoresist layer in a second region of the substrate;
forming a plurality of trenches in the photoresist layer in the first region; and
reflowing the photoresist layer to fill in the plurality of trenches.

9. The method of claim 8, wherein the plurality of features include a gate electrode.

10. The method of claim 8, wherein forming the plurality of trenches in the photoresist layer in the first region includes performing a lithography radiation exposing process through a photomask to the photoresist layer.

11. The method of claim 10, wherein the photomask includes a plurality of openings to define the plurality of trenches.

12. The method of claim 11, wherein a width of each of the plurality of openings varies from one opening to another opening.

13. The method of claim 11, wherein the plurality of openings each have the same width.

14. The method of claim 8, wherein re-flowing the photoresist layer to fill in the plurality of trenches includes performing an annealing process to the photoresist layer.

15. A method comprising:
forming a flowable-material (FM) layer over a first region of a substrate and a second region of the substrate, wherein a top surface of the FM layer in the first region is higher than a top surface of the FM layer in the second region;
forming a patterned photoresist layer over the FM layer;
forming a plurality of trenches in the FM layer in the first region through the patterned photoresist layer; and
performing annealing process to reflow the FM layer into the plurality of trenches.

16. The method of claim 15, wherein forming the patterned photoresist layer over the FM layer includes performing a lithography radiation exposing process through a photomask to the photoresist layer.

17. The method of claim 16, wherein the photomask includes a plurality of openings to define the plurality of trenches such that a width of each of the plurality of openings varies from one opening to another opening.

18. The method of claim 16, wherein the photomask includes a plurality of openings to define the plurality of trenches such that each of the plurality of openings has the same width.

19. The method of claim 16, wherein the photomask includes a plurality of openings to define the plurality of trenches such that a total number of the plurality of openings varies from on first region to another first region.

20. The method of claim 15, further comprising forming a plurality of gate stacks over the first region of the substrate prior to forming the FM layer over the first region of the substrate and the second region of the substrate, and
wherein forming the plurality of trenches in the FM layer in the first region includes selectively etching the FM layer without etching the plurality gate stacks.

* * * * *